United States Patent
Sugasawara et al.

[11] Patent Number: 6,061,814
[45] Date of Patent: May 9, 2000

[54] TEST CIRCUITRY FOR DETERMINING THE DEFECT DENSITY OF A SEMICONDUCTOR PROCESS AS A FUNCTION OF INDIVIDUAL METAL LAYERS

[75] Inventors: Emery O. Sugasawara, Pleasanton; V. Swamy Irrinki, Milpitas, both of Calif.

[73] Assignee: LSI Logic Corporation, Milpitas, Calif.

[21] Appl. No.: 09/063,801

[22] Filed: Apr. 21, 1998

[51] Int. Cl.$^7$ .................................................. G01R 31/28
[52] U.S. Cl. ............................................................ 714/724
[58] Field of Search ........................... 714/724; 324/73.1, 324/158.1, 765; 326/16; 395/500.6, 500.12

[56] References Cited

U.S. PATENT DOCUMENTS

| | | | |
|---|---|---|---|
| 4,486,705 | 12/1984 | Stopper | 324/73.1 |
| 5,068,547 | 11/1991 | Gascoyne | 307/443 |
| 5,479,109 | 12/1995 | Lau et al. | 324/758 |
| 5,486,786 | 1/1996 | Lee | 327/378 |
| 5,663,967 | 9/1997 | Lindberg et al. | 371/26 |
| 5,724,251 | 3/1998 | Heavlin | 395/500.6 |
| 5,905,383 | 5/1999 | Frisch | 324/765 |

OTHER PUBLICATIONS

LSI Logic Corporation, "Process Monitor (PROCMON) Cell", Feb. 1997, pp. 1–12, DB06–000042–05, Copyright © 1995, 1996 & 1997.

*Primary Examiner*—Hoa T. Nguyen
*Attorney, Agent, or Firm*—Akin, Gump, Strauss, Hauer & Feld, LLP

[57] ABSTRACT

A test structure according to the present invention provides a technique for determining defects as a function of metal layers. The technique is implemented by dividing the test structure into individual test blocks that correspond to certain metal layers. In the disclosed embodiment, for example, a test structure formed by a semiconductor process utilizing three layers of interconnect metal includes three distinct test blocks having similar or identical underlying test logic. In a first test block, the underlying test logic is predominantly connected by the first metal layer. In a second test block, the underlying test logic is predominantly connected by the second metal layer. In a third test block, the underlying test logic is primarily connected by the third metal layer. During the testing stage, test patterns are applied to each test block and the results are tabulated. Faults detected in a test block are allocated to the metal layer(s) corresponding to the predominant metal routing layer of the test block. Because the test logic is the same, faults due to the underlying test logic or transistors comprising the test logic can be discounted. In this manner, the test results of the different test blocks can be compared and problems with a specific metal or via layer are readily identified. In one embodiment of the invention, the test structure is located on a production die. In another embodiment, the test structure is located on a test die.

22 Claims, 6 Drawing Sheets

TEST CIRCUITRY FOR DETERMINING THE DEFECT DENSITY OF A SEMICONDUCTOR PROCESS AS A FUNCTION OF INDIVIDUAL METAL LAYERS

BACKGROUND OF THE INVENTION

1. Field of the Invention

The present invention relates to testing of semiconductor devices, and more particularly to a technique for determining defect density as a function of individual metal layers in a semiconductor process employing multiple metal layers.

2. Description of the Related Art

Integrated circuits have become key components of many consumer and commercial electronic products, often replacing discrete components and enhancing product functionality. The semiconductor processing technologies that produce these integrated circuits have advanced to the point where complete systems can now be reduced to a single integrated circuit or application specific integrated circuit (ASIC) device. These integrated circuits (also referred to as "chips") may use many functions that previously could not be implemented together on a single chip, including: microprocessors, digital signal processors, mixed signal and analog functions, large blocks of memory and high speed interfaces. It is a common practice for the manufacturers of such integrated circuits to test device functionality at the manufacturing site. However, the complex nature of today's integrated circuits presents new testing challenges.

Interconnecting the millions of logic gates and megabytes of memory that may be present on a chip also poses difficulties. To aid in this task, new multiple layer metallization schemes have been developed that allow up to five or more distinct "levels" or layers of metal interconnect wires, with pitches of 0.125 $\mu$m and tighter on the first few layers. In such multiple layer metallization schemes, the various metal interconnect wires typically have different nominal widths and heights, different distances from transistor gates, and are insulated by oxide layers of varying thickness. The differences in the physical properties of the metal layers cause different metal layers to exhibit somewhat dissimilar electrical characteristics. Further, because each of the metal layers in manufactured in separate process steps involving separate masks, systemic process variations may cause some metal layers to be more susceptible to defects or faults.

Typical metallization faults include undercutting, burnout, open circuits due to electrostatic discharge, and oxide cracks. Additional problems may occur at junction or via structures between metal layers. As known to those skilled in the art, a via is an opening in an insulating layer between metal layers that provides an electrical pathway from one metal layer to the metal layer above or below it. If the etchant used to form an opening in the insulating layer is utilized to excess, a chemical reaction may take place between the underlying metal layer and the etchant. The chemical reaction may result in pin holes in the metal layer, thereby causing a defective via structure. Likewise, if the etchant is under utilized an unwanted layer of insulating material may remain, preventing electrical contact between the metal layers.

When the various metal layers are formed using aluminum-based materials, other problems may exist. Because aluminum is a reactive metal, the use of aluminum can result in the formation of certain undesired compounds such as oxides. Oxides act as an insulator and may prevent the formation of reproducible ohmic contacts between the lower and upper metal layers. Again, since the individual metal layers are formed at different stages of the manufacturing process, process variations at a given step may adversely affect only one or two metal layers or the via structures between them. Isolating such problems can be difficult in multiple layer metallization schemes.

In an to effort avoid interconnect and other problems, an integrated circuit design is typically simulated and verified in a software environment using a variety of CAE and design verification tools, before the integrated circuit is actually fabricated. Such software processes function to reduce costly design iterations because modifications to an integrated circuit design are more readily achieved via software. However, existing software utilizes predetermined manufacturing process information that does not reflect process variations which may give rise to metallization defects or faults.

Once fabricated, integrated circuits or die are typically tested using automated test equipment (ATE). Although device functionality can be verified, production test procedures may not aid a process engineer in determining the precise cause of defects. Integrated circuits having defects entailing vias and metal interconnect wires generally fail functional or parametric testing regardless of the metal layer(s) involved. Therefore, if a process problem develops which causes defects in a given metal layer, production testing may not allow the problem to be accurately pinpointed. If the test strategy employed does not allow the design or process engineers to isolate defects as a function of an individual metal layer, remedial measures are difficult to implement.

One prior method of determining defect density as a function of individual metal layers involves creating separate test die for individual metal layers. The test die are included on production wafers, and predominantly utilize a single metal layer for providing interconnections between test structures. Using such an approach, an integrated circuit using five metal layers requires five separate test die structures. Each of the test die therefore requires a unique mask set. This approach is expensive and necessitates separate production lots using different mask sets in order to correlate faults with specific metal layers. To track process defects, it would be desirable to develop a technique that allows a design or process engineer to determine defect density as a function of an individual metal layer without using a different test die for each metal layer.

SUMMARY OF THE INVENTION

Briefly, a test structure according to the present invention provides a technique for determining defect density as a function of a specific metal layer in integrated circuits utilizing multiple metal layers. The test structure includes test blocks which allow each metal layer to be analyzed separately. The test structure is capable of being placed on a single test die, thereby obviating the need for additional mask sets and simplifying the testing process.

By testing all metal layers with a single test structure, the defect density per metal layer can be more accurately predicted and process variations which result in metal faults in particular metal layers are more readily identifiable. The technique is implemented by dividing the test structure into individual test blocks corresponding to certain metal layers. In the disclosed embodiment of the invention, the test structure includes a number of test blocks equal to or greater than the number of metal layers used in the semiconductor process. In a three metal layer process, for example, a test structure in accordance with the invention includes at least three test blocks. A first test block includes underlying test logic primarily interconnected in the first metal layer; a second test block includes underlying test logic primarily interconnected in the second metal layer; and a third test block includes underlying test logic primarily interconnected in the third metal layer. Preferably, the test logic is similar or identical in each block.

Many alternate embodiments are possible. Rather than a separate test die, for example, the test structure may be included as part of the production die itself. It is also contemplated that the metal interconnects of the test blocks may contain varying ratios of the different metal layers.

The test logic in each test block dictates the number of input and output probe/bond pads that are required to adequately test the block. The underlying test logic is comprised of a number of logic cells connected as registers, adders, etc.—the precise nature of the test logic is not critical to the invention.

During the testing stage, test patterns are applied to each test block and the results are tabulated. Faults detected in a test block are allocated to the metal layer(s) corresponding to the test block. Because the test logic is the same, faults due to the underlying test logic or transistors comprising the test logic can be discounted. In this manner, the test results of the different test blocks can be compared and problems with a specific metal (or via) layer can be readily identified.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
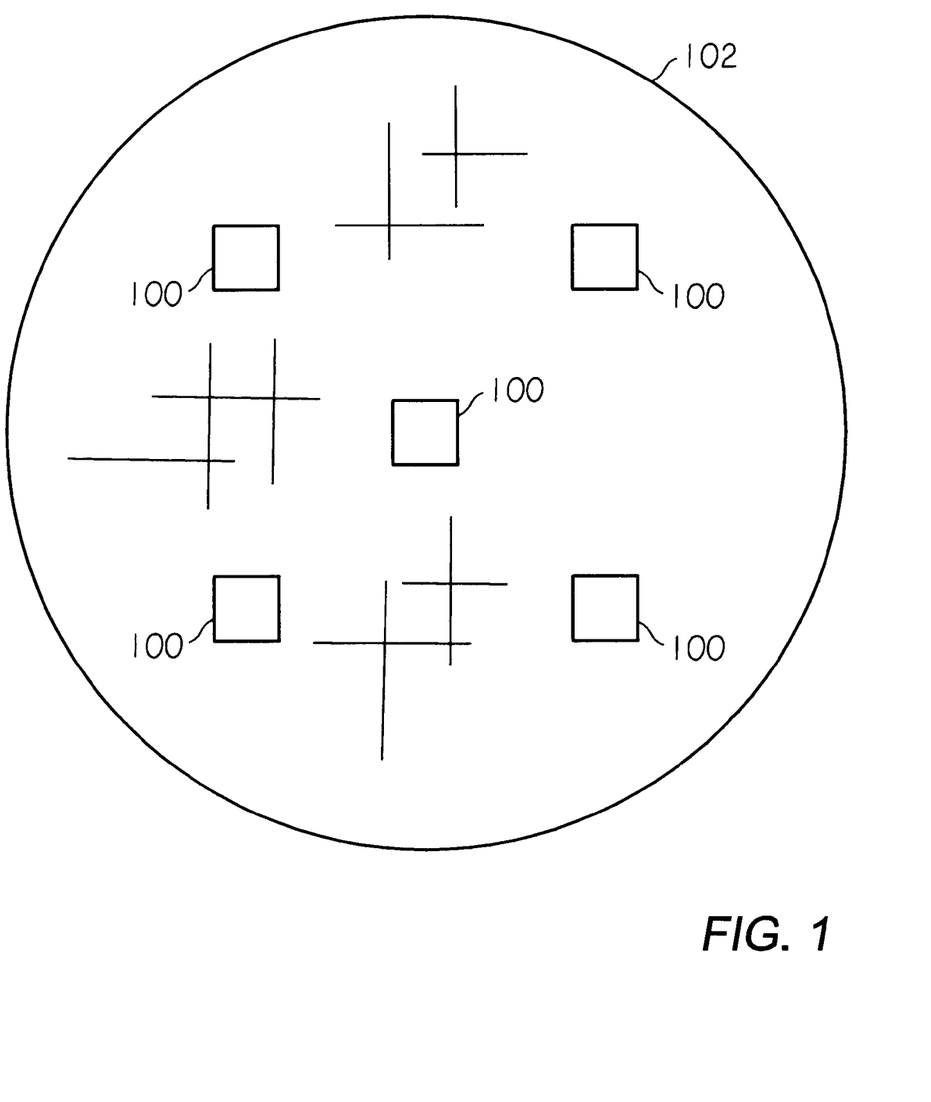
FIG. 1 is a graphical illustration of a semiconductor wafer containing test structures according to the present invention.

Turning now to FIG. 1, a production semiconductor wafer 102 containing test structures 100 according to the present invention is shown. In addition to containing a large number of production integrated circuits or die, the production wafer 102 preferably includes a plurality of test structures 100 spaced to account for process variations across the surface of the wafer. The test structures permits correlation between defect/fault data and specific layers of metal used in the semiconductor process for the wafer 102. A plurality of test structures 100 are shown, although defect/fault data can be provided by a single test structure 100.

The size of the test structures 100 is not considered critical to the invention, and may be predetermined or variable in relation to the size of the production integrated circuits. In a testing procedure according to the preferred embodiment of the invention, each test structure 100 is analyzed by automated test equipment (ATE) prior to the separation or sawing process that separates the production integrated circuits for packaging. An exemplary testing procedure in accordance with the invention is shown below in FIG. 6. Also, it is contemplated that the test structures 100 could be included within a production die, although an undesirable increase in die size might result if the production die is not pad limited.

Figure 2:
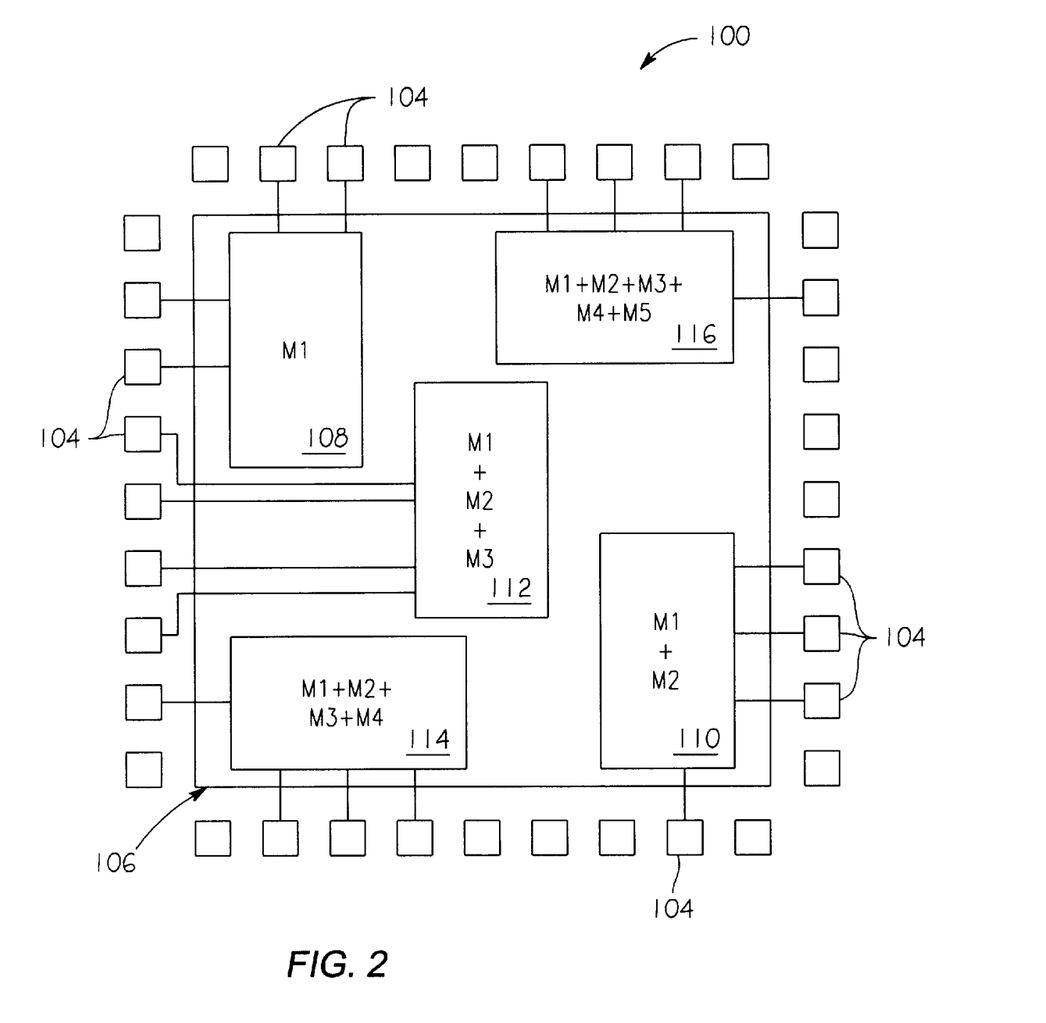
FIGS. 2 and 3 are schematic drawings of alternate embodiments of a test structure incorporating test blocks in accordance with the present invention.

Referring now to FIG. 2, a first embodiment of a test structure 100 incorporating test blocks 108, 110, 112, 114, and 116 in accordance with the present invention is shown. In this embodiment of the invention, the number of test blocks is equal to the number of metal layers used in the semiconductor process used with the production semiconductor wafer 102. It will be recognized by those skilled in the art that the invention can be utilized in a semiconductor process employing any number of metal layers. The precise number of metal layers is not considered critical to the invention.

In the embodiment of the invention depicted in FIG. 2, test blocks 108–116 are used to correlate metallization defects/faults to five different metal layers M1, M2, M3, M4 and M5. Each of the disclosed test blocks 108–116 provides testing data for a specific metal layer.

The test blocks 108–116 are disposed in a core logic region 106, which may also contain other test logic or test structures (not shown). To aid in the testing process, each of the test blocks 108–116 is provided with test input signals via bond pads/probe points 104. Test signal outputs from each of the test blocks 108–116 are also provided to bonding pads/probe points 104. As discussed in greater detail in conjunction with FIGS. 4A–4C, the number of test signal inputs and outputs is dependent upon the configuration of the underlying test logic of each of the test blocks 108–116, as is the number of bonding pads/probe points 104. Neither the number nor arrangement of the bonding pads/probe points 104 is considered critical to the invention.

In the embodiment of the invention shown in FIG. 2, one test block 108–116 is provided for each metal layer. For example, the test block 108 is used to correlate faults detected by the testing process to a first layer of metal (M1). Similarly, test block 110 is used to examine a second layer of metal (M2); test block 112 is utilized to examine a third layer of metal (M3); test block 114 is used to examine a fourth layer of metal (M4); and test block 116 is used to examine a fifth layer of metal (M5).

Figure 3:
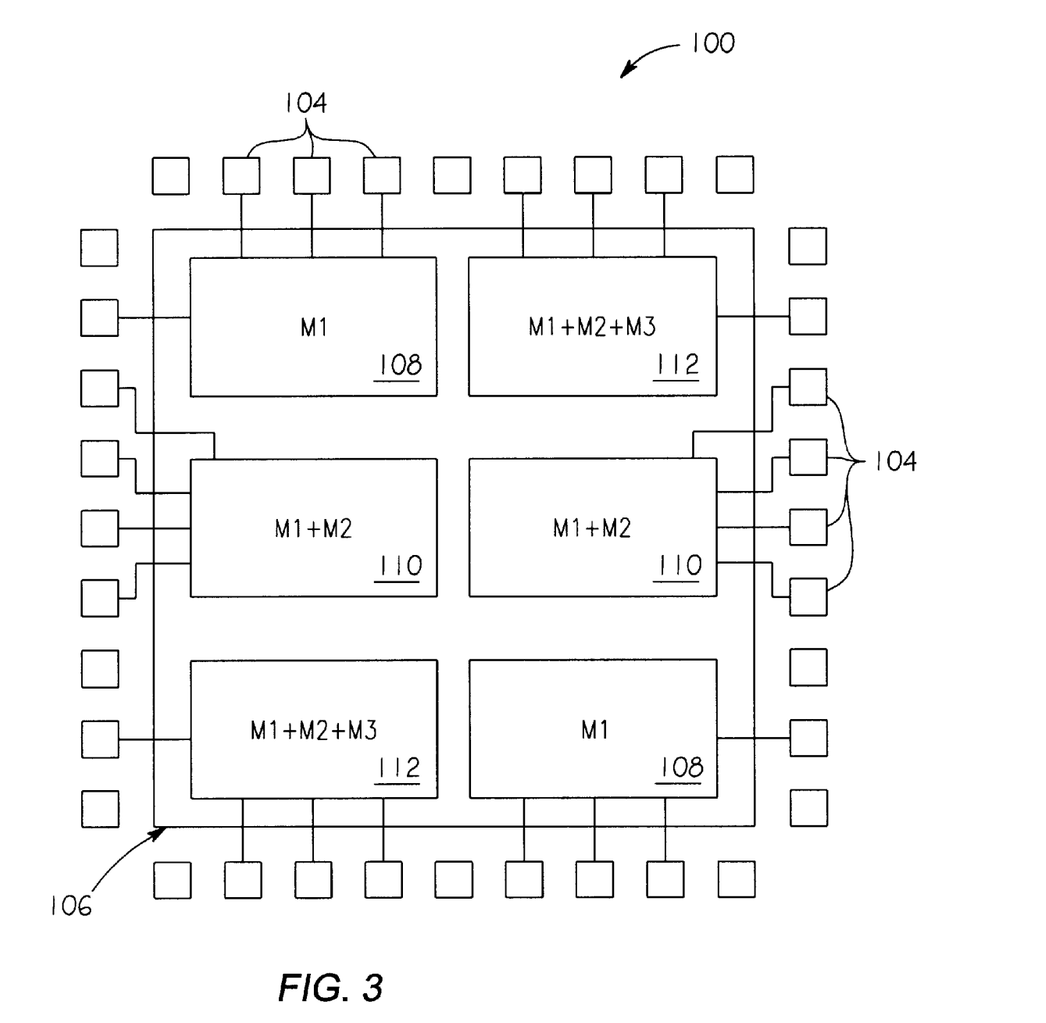

Referring now to FIG. 3, a second embodiment of a test structure 100 incorporating test blocks 108–112 in accordance with the present invention is shown. In this embodiment of the invention, test blocks 108–112 for analyzing only three layers of metal are shown for sake of clarity. Multiple instances of the test blocks 108–112 are provided in order to better account for the effects of process variations that may occur across the test structure 100. Such process variations may cause defects in one of the test blocks 108 that are not observed in a corresponding test block 108–112 on a different portion of the test structure 100.

As with the test structure 100 of FIG. 2, test blocks 108 are comprised of underlying test logic interconnected primarily in the first layer metal M1; test blocks 110 are comprised of underlying test logic interconnected primarily in the second layer metal M2; and test blocks 112 are comprised of underlying test logic interconnected primarily in the third layer metal M3. It is also contemplated that the metal interconnect routing of the test blocks 108–116 may contain varying ratios of the different metal layers.

Figure 4A:
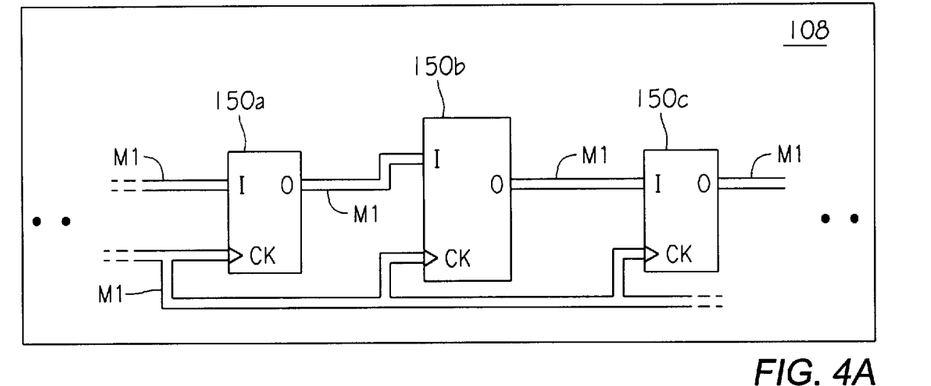
FIGS. 4A–4C are schematic drawings showing exemplary details of the test blocks of FIGS. 2 and 3.
Figure 4B:
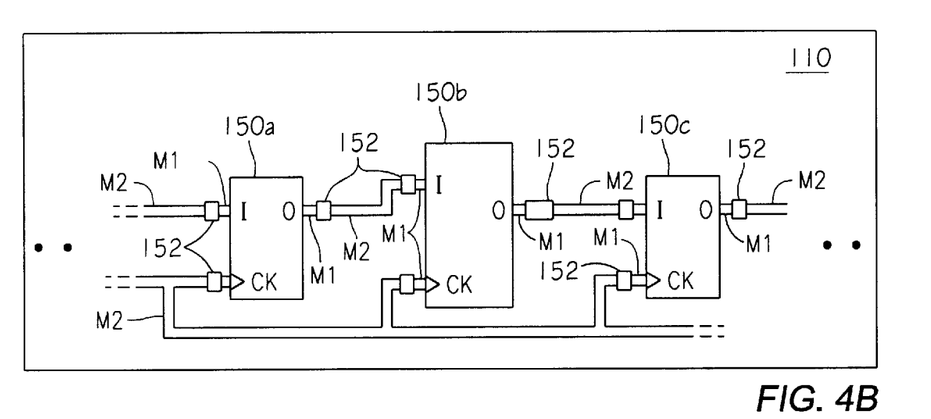
Figure 4C:
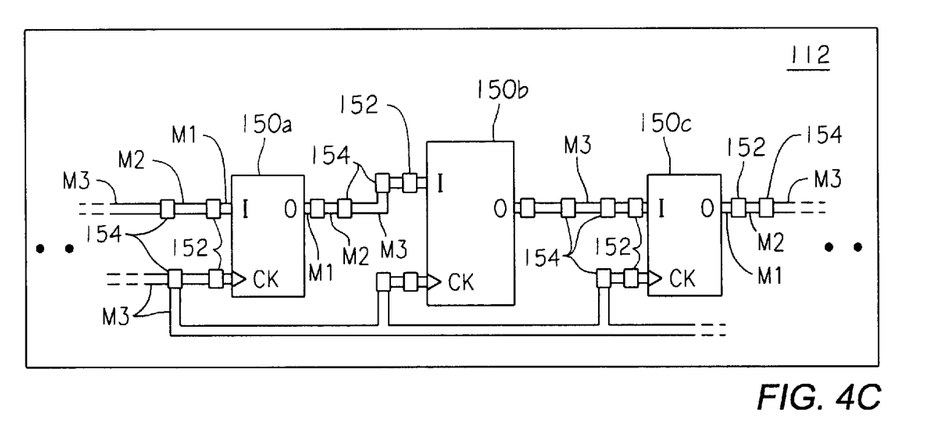

Exemplary details of the test blocks 108–112 of FIGS. 2 and 3 are illustrated in greater detail in FIGS. 4A–4C.

Referring first to FIG. 4A, a test block 108 is shown. The test block 108 is comprised of a plurality of test logic gates 150a–150c. The test logic gates 150a–150c are preferably standard logic gates that have been configured as test logic capable of providing test output signals in response to known test input signals. Such test signals are provided to testing equipment through bonding pads/probe points 104.

As will be appreciated by those skilled in the art, the precise configuration of the test logic is not considered critical to the invention, and many variations are possible. The underlying test logic may include, for example, common test circuitry such as built-in self-test (BIST) logic, an IEEE 1149.1 compliant interface and boundary scan structures. Only three test logic gates 150a, 150b, and 105c are shown in FIGS. 4A–4C for sake of clarity. Each of the test logic gates 150a–150c includes an input port 1 and an output port O. Each of the test logic gates 150a–150c also includes a clock input port CK used for a clock signal that synchronizes the underlying test logic gates 150 and aids in the testing process.

In test logic block 108 of FIG. 4A, interconnect signal routing between the various test logic gates 150a–150c is accomplished in a first metal layer M1. As shown, input signals to the test logic gate 150a are provided over a first metal layer M1, while the output of the test logic gate 150a is provided to the input of the test logic gate 150b via a signal line also formed of the first metal layer M1. Similarly, the output of the test logic gate 150b is provided to the input of the test logic gate 150c via a signal line formed of the first metal layer M1. In addition, the clock signal to each of the test logic gates 150a–150c is also provided via a first layer metal M1 signal line. It will be appreciated by those skilled in the art that, depending on the configuration of the underlying test logic, signal routing in various other metal layers (not shown) may also be required to prevent short circuits in the signal lines. In the disclosed embodiment of the invention, however, the majority of the signal interconnect lines (or signal routing) are formed in the first layer metal M1. In this manner, faults detected in the test output signals provided by the test block 108 are predominantly attributable to either the underlying test logic or the first metal layer M1 signal lines.

Referring now to FIG. 4B, details of an exemplary test block 110 are shown. In the test block 110, the underlying test logic gates 150 are preferably identical or substantially similar to those of the other test blocks. In the test block 110, routing between individual test logic gates 150a–150c is accomplished primarily in a second metal layer M2. In the disclosed embodiment of the invention, the test logic gates 150a–150c have input and output ports that are rottable to the first metal layer M1, thus necessitating a certain amount of first metal layer M1 in the signal routing lines. It will be appreciated by those skilled in the art, however, that the input and output ports to the test logic gates 150a–150c could be rottable in a second metal layer M2 or other metal layer.

Referring more specifically to test block 110, signal lines between the test logic gates 150a–150c are primarily formed of the second metal layer M2. Referring to the output port O of the test logic gate 150a, for example, a relatively short portion of first metal layer M1 signal routing is electrically coupled to the output port O, which is coupled to internal routing in the test logic gate 150a. The first metal layer M1 routing is coupled to a longer second metal layer M2 signal line by means of a via structure 152. As mentioned above, a via is an opening in an insulating layer between metal layers that provides an electrical pathway from one metal layer to the metal layer above or below it. The other output ports O, the input ports I and the clock signal ports CK of the test logic gates 150 are similarly coupled to each other. Since most of the signal line routing in the test block 110 is formed of the second metal layer M2, faults detected during the testing process are predominantly attributable to either the underlying test logic, the via structures 152, or the second metal layer M2 signal lines.

Referring now to FIG. 4C, details of an exemplary test block 112 are shown. In the test block 112, the underlying test logic gates 150 are again preferably identical or substantially similar to the test logic gates 150 of the other test blocks. In the test block 112, routing between individual ones of the test logic gates 150a–150c is accomplished primarily in a third metal layer M3. Again, connections to the ports of the test logic gates 150a–150c are accomplished by first metal layer M1 signal lines, although other metal layers could be utilized depending on the internal configuration of the test logic gates 150a–150c. The second metal layer M2 and via structures 152 and 154 are provided as needed to connect the ports of the test logic gates 150a–150c to signal lines foxed of the third metal layer M3. Although separate via structures 152 and 154 are illustrated, it will be appreciated that "stacked" via structures (not shown) could be used instead to minimize the amount of second layer metal M2.

Since most of the signal line routing in the test block 112 is formed of the third metal layer M3, faults detected during the testing process are predominantly attributable to either the underlying test logic, the via structures 152 and 154, or the third metal layer M3 signal lines. By comparing the test results of other test blocks as described more fully below, defects attributable to the via structures 154 and/or the third metal layer M3 are identifiable. Although not explicitly detailed, other test blocks 114 and 116 (See FIG. 2) are similarly configured to include underlying test logic primarily interconnected in fourth and fifth metal layers, respectively (assuming a semiconductor process utilizing five metal layers for signal lines). In another embodiment of the invention, the ratios between the different metal layers M1–M5 are varied to more closely approximate the metal ratios of a production integrated circuit.

Figure 5A:
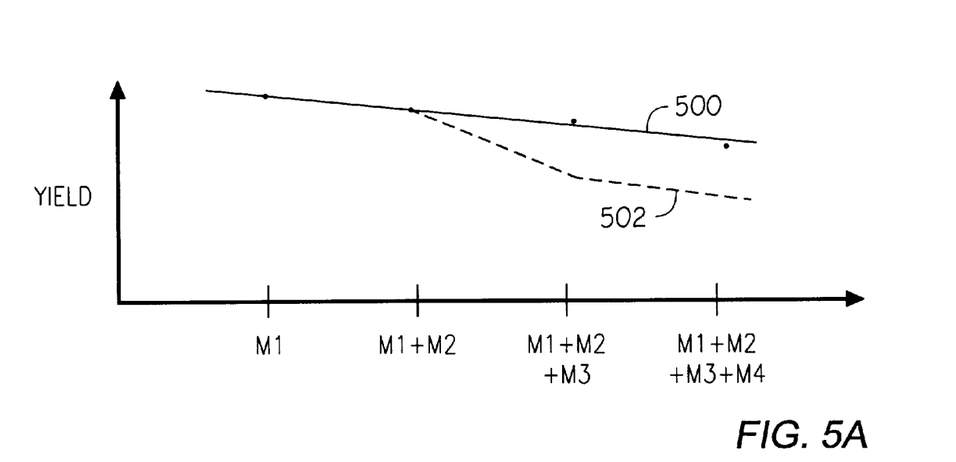
FIGS. 5A and 5B are graphs illustrating exemplary yields and defect densities, respectively, of integrated circuits as a function of metal layers.
Figure 5B:
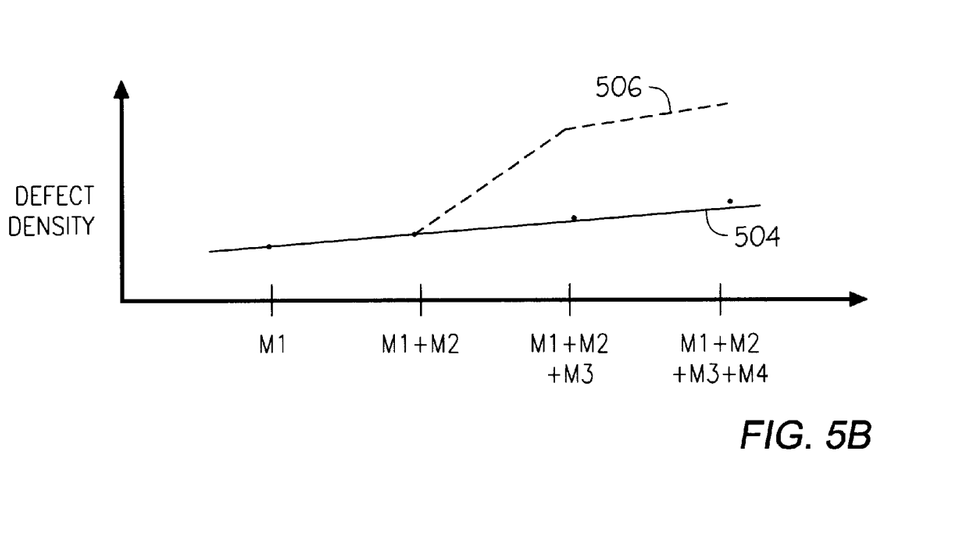

FIGS. 5A and 5B are graphs illustrating exemplary yields and defect densities, respectively, of integrated circuits as a function of different combinations of metal layers M1–M4. Referring first to FIG. 5A, graph line 500 represents yield in a typical production process as a function of the number of metal layers M1–M4 that are utilized. As the complexity of the integrated circuitry grows with each additional metal layer M1–M4, a slight decrease in yield can be expected in typical processes. This decrease in yield is reflected by graph line 504 of FIG. 5B, which shows a slight increase in defect density with each additional metal layer M1–M4.

When a process variation or problem causes metallization faults, yield and defect density may vary in a discernible manner. For example, dashed graph lines 502 and 506 demonstrate deviations in yield and defect density, respectively, resulting from a process variation causing localized defects in the third metal layer M3 or the via structures coupled to the third metal layer M3. Deviations such as those represented by dashed graph lines 502 and 506 are generally detectable by a test structure 100 according to the present invention.

Figure 6:
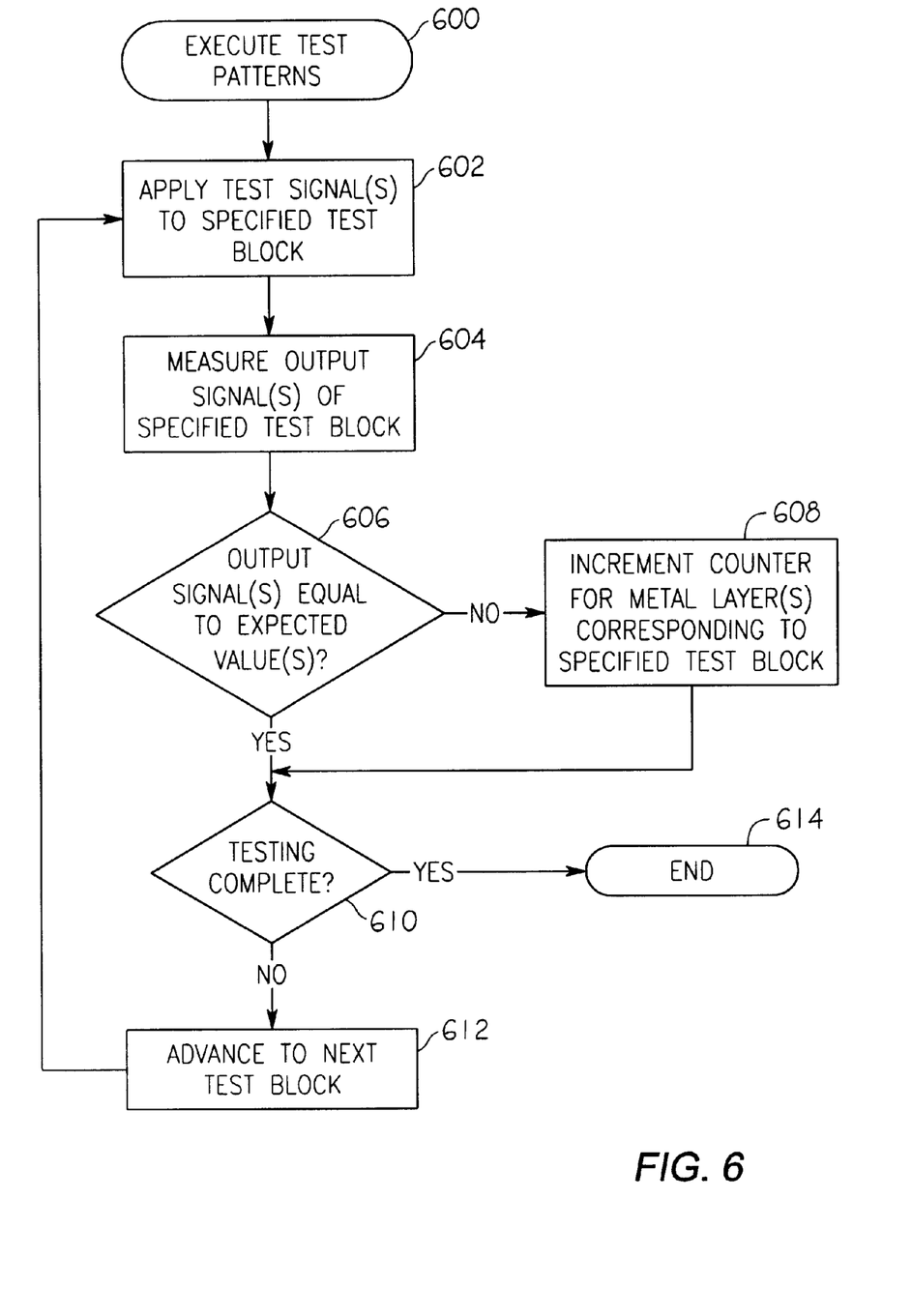
FIG. 6 is a flow chart illustration of a test process according to the invention for correlating metal faults and defects to specific metal layers.

Referring now to FIG. 6, a flow chart illustration of an exemplary test process for correlating metal faults and process variations to specific metal layers is shown. This test process is performed on a testing apparatus, preferably automated test equipment (ATE) utilizing a probe station. The testing process commences in step 600, where test patterns corresponding to the test structures 100 are executed.

Next, in step 602, input test signal(s) are applied to the bond pads/probe points 104 corresponding to the specified test block 108–116 under test. The output test signal(s) of the test block 108–116 under test are retrieved or measured in step 604 following a predetermined interval corresponding to the amount of time required for the test logic gates 150 to process the input test signals. These output signal(s) are compared to expected values in step 606. If the output signal(s) match the expected values, control passes to step 610. If the output signal(s) do not match the expected values, control instead passes to step 608 and a counter or other tabulating means is incremented for the metal layer M1–M5 corresponding to the test block 108–116 being examined. It should be evident that, depending upon the underlying test logic and metal signal routing, multiple test processes may be required to assign a given defect to a particular metal layer M1–M5.

Following either of steps 606 or 608, control proceeds to step 610 where it is determined if the testing process is complete. If not, test patterns for the next test block 108–116 are initiated in step 612 and control returns to step 602. In the preferred embodiment of the invention, the same test patterns are applicable to each test block 108–116. If testing is complete as determined in step 610, the testing process is ended in step 614. The testing process of FIG. 6 is exemplary in nature, and numerous variations are contemplated.

Thus, test structure and method have been described for determining defects as a function of metal layers. The technique is implemented by dividing the test structure into individual test blocks. Faults detected in the test blocks are allocated to the metal layer(s) corresponding to the predominant metal routing layer of the test block. Because the test logic is the same or similar in each test block, faults due to the underlying test logic or transistors comprising the test logic can be discounted. In this manner, the test results of the different test blocks can be compared and problems with a specific metal or via layer are readily identified.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

What is claimed is:

1. A test structure for associating defects in a semiconductor process with individual metal layers, the semiconductor process having at least a first metal layer and a second metal layer for forming signal lines, the test structure comprising:
    a first plurality of test logic gates coupled in a testable configuration by signal lines formed primarily of the first metal layer; and
    a second plurality of test logic gates coupled in a testable configuration by signal lines formed primarily of the second metal layer,
    the first plurality of test logic gates and the second plurality of test logic gates disposed on a single integrated circuit die.

2. The test structure of claim 1, wherein the testable configuration of the first plurality of test logic gates and the testable configuration of the second plurality of test logic gates are substantially similar.

3. The test structure of claim 1, further comprising a plurality of bond pads/probe points coupled to the first and second plurality of test logic gates for providing test signal inputs and receiving test signal outputs.

4. The test structure of claim 1, the semiconductor process having a third metal layer for forming signal lines, the test structure further comprising:
    a third plurality of test logic gates coupled in a testable configuration by signal lines formed primarily of the third metal layer,
    the third plurality of test logic gates disposed on the integrated circuit die.

5. The test structure of claim 4, the semiconductor process having at least one additional metal layer for forming signal lines, the test structure further comprising:
    at least one additional plurality of test logic gates corresponding in number to the number of additional metal layers, the at least one additional plurality of test logic gates coupled in a testable configuration by signal lines formed primarily of one of the at least one additional metal layers,
    the at least one additional plurality of test logic gates disposed on the integrated circuit die.

6. The test structure of claim 5, wherein the testable configuration of the at least one additional plurality of test logic gates is substantially similar to the testable configurations of the first, second and third plurality of test logic gates.

7. The test structure of claim 1, further comprising at least one additional instance of each of the first plurality of test logic gates and the second plurality of test logic gates disposed on the integrated circuit die.

8. The test structure of claim 1, wherein the integrated circuit die is a production integrated circuit.

9. The test structure of claim 1, wherein the integrated circuit die is a test die.

10. A method for associating defects in a semiconductor process with individual metal layers, the semiconductor process having at least a first metal layer and a second metal layer for forming signal lines, the method comprising the steps of:
    providing a test structure on an integrated circuit die, the test structure comprising:
        a first plurality of test logic gates coupled in a testable configuration by signal lines formed primarily of the first metal layer; and
        a second plurality of test logic gates coupled in a testable configuration by signal lines formed primarily of the second metal layer;
    applying a test signal(s) to the first plurality of test logic gates;
    measuring a test output(s) of the first plurality of test logic gates;
    applying a test signal(s) to the second plurality of test logic gates; and
    measuring a test output(s) of the second plurality of test logic gates.

11. The method of claim 10, further comprising the steps of:
    comparing the measured test output(s) of the first plurality of test logic gates to an expected value(s) to ascertain the number of faults in the testable configuration of the first plurality of test logic gates; and comparing the measured test output(s) of the second plurality of test logic gates to an expected value(s) to ascertain the number of faults in the testable configuration of the second plurality of test logic gates.

12. The method of claim 11, further comprising the step of:

attributing the number of ascertained faults in the testable configuration of the first plurality of test logic gates to semiconductor process steps associated with the first metal layer if the number of ascertained faults in the testable configuration of the first plurality of test logic gates exceeds a first predetermined value and the number of ascertained faults in the testable configuration of the second plurality of test logic gates is less than a second predetermined value.

13. The method of claim 11, further comprising the step of:

attributing the number of ascertained faults in the testable configuration of the second plurality of test logic gates to semiconductor process steps associated with the second metal layer if the number of ascertained faults in the testable configuration of the second plurality of test logic gates exceeds a first predetermined value and the number of ascertained faults in the testable configuration of the first plurality of test logic gates is less than a second predetermined value.

14. The method of claim 10, wherein the test signal(s) applied to the first plurality of test logic gates and the test signal(s) applied to the second plurality of test logic gates are substantially the same.

15. The method of claim 10, the semiconductor process having at least one additional metal layer for forming signal lines, the test structure further comprising at least one additional plurality of test logic gates coupled in a testable configuration by signal lines formed primarily of the at least one additional metal layer, the method further comprising the steps of:

applying a test signal(s) to the at least one additional plurality of test logic gates; and measuring a test output(s) of the at least one additional plurality of test logic gates.

16. The method of claim 15, further comprising the steps of:

comparing the measured test output(s) of the first plurality of test logic gates to an expected value(s) to ascertain the number of faults in the testable configuration of the first plurality of test logic gates;

comparing the measured test output(s) of the second plurality of test logic gates to an expected value(s) to ascertain the number of faults in the testable configuration of the second plurality of test logic gates; and comparing the measured test output(s) of the at least one additional plurality of test logic gates to an expected value(s) to ascertain the number of faults in the testable configuration of the at least one additional plurality of test logic gates.

17. The method of claim 16, further comprising the step of:

attributing the number of ascertained faults in the testable configuration of the at least one additional plurality of test logic gates to semiconductor process steps associated with the at least one additional metal layer if the number of ascertained faults in the testable configuration of the first plurality of test logic gates exceeds a first predetermined value and the number of ascertained faults in the testable configuration of each of the first and second pluralities of test logic gates is less than a second predetermined value.

18. The method of claim 15, wherein the test signal(s) applied to the first plurality of test logic gates, the test signal(s) applied to the second plurality of test logic gates, and the test signal(s) applied to the at least one additional plurality of test logic gates are substantially the same.

19. A semiconductor wafer containing a plurality of integrated circuit die and a plurality of test structures for associating defects in a semiconductor process with individual metal layers, the semiconductor process employing at least a first metal layer and a second metal layer for forming signal lines, each of the test structures comprising:

a first plurality of test logic gates coupled in a testable configuration by signal lines formed primarily of the first metal layer; and a second plurality of test logic gates coupled in a testable configuration by signal lines formed primarily of the second metal layer, the first plurality of test logic gates and the second plurality of test logic gates disposed on a single one of the integrated circuit die.

20. The semiconductor wafer of claim 19, wherein the testable configuration of the first plurality of test logic gates and the testable configuration of the second plurality of test logic gates are substantially similar.

21. The semiconductor wafer of claim 19, each of the test structures further comprising a plurality of bond pads/probe points coupled to the first and second plurality of test logic gates for providing test signal inputs and receiving test signal outputs.

22. The semiconductor wafer of claim 19, the semiconductor process employing at least one additional metal layer for forming signal lines, each of the test structures further comprising:

at least one additional plurality of test logic gates corresponding in number to the number of additional metal layers, the at least one additional plurality of test logic gates coupled in a testable configuration by signal lines formed primarily of one of the at least one additional metal layers, the at least one additional plurality of test logic gates disposed on the integrated circuit die.

* * * * *